United States Patent [19]

Derby

[11] Patent Number: 5,565,780
[45] Date of Patent: Oct. 15, 1996

[54] NMR RADIO-FREQUENCY COIL

[75] Inventor: Kevin A. Derby, San Bruno, Calif.

[73] Assignee: Toshiba America MRI, Inc., San Francisco, Calif.

[21] Appl. No.: 247,744

[22] Filed: May 23, 1994

Related U.S. Application Data

[62] Division of Ser. No. 67,341, May 25, 1993, Pat. No. 5,315, 251, which is a continuation of Ser. No. 630,158, Dec. 19, 1990, abandoned.

[51] Int. Cl.⁶ ........................................... G01R 3/00
[52] U.S. Cl. ............................. 324/322; 324/318
[58] Field of Search ........................ 324/322, 318, 324/309, 307, 314; 128/653.5

[56] References Cited

U.S. PATENT DOCUMENTS

| | | | |
|---|---|---|---|
| 4,439,733 | 3/1984 | Hinshaw | 324/322 |
| 4,680,548 | 7/1987 | Edelstein et al. | 324/318 |
| 4,691,163 | 9/1987 | Blass et al. | 324/318 |
| 4,692,705 | 9/1987 | Hayes | 324/318 |
| 4,694,255 | 9/1987 | Hayes | 324/318 |
| 4,712,067 | 12/1987 | Roschmann et al. | 324/318 |
| 4,820,985 | 4/1989 | Eash | 324/318 |
| 4,973,908 | 11/1990 | Bottomley et al. | 324/318 |
| 5,003,265 | 3/1991 | Leussler | 324/318 |
| 5,041,790 | 8/1991 | Tropp et al. | 324/318 |
| 5,091,708 | 2/1992 | Bezjak | 324/318 |
| 5,365,173 | 11/1994 | Zou et al. | 324/318 |

FOREIGN PATENT DOCUMENTS

| | | | |
|---|---|---|---|
| 6475951 | 3/1989 | Japan | 324/322 |

OTHER PUBLICATIONS

D. I. Hoult, et al. "Quadrature Detection In The Laboratory Frame", *Magnetic Resonance In Medicine* 1, 339–353 (1984).

"An Efficient Decoupler Coil Design Which Reduces Heating In Conductive Samples In Superconducting Spectrometers", *Journal of Magnetic Resonance* 36, 447–451 (1979).

V. J. Sank, et al. "A Quadrature Coil For The Adult Human Head", *Journal of Magnetic Resonance* 69, 236–242 (1986).

I. J. Lowe, et al. "A Fast Recovery Pulsed Nuclear Magnetic Resonance Sample Probe Using A Delay Line", Rev. Sci. Instrum., vol. 45, No. 5, May 1974 (pp. 631–639).

I. J. Lowe, et al. "Homogeneous RF Field Delay Line Probe For Pulsed Nuclear Magnetic Resonance", Rev. Sci. Instrum., vol. 48, No. 3, Mar. 1977 (pp. 268–274).

Lizann Bolinger, et al. "A Multiple–Frequency Coil With A Highly Uniform $B_1$ Field" *Journal of Magnetic Resonance* 81, 162–166 (1988).

Irving J. Lowe, "Improving The RF Field Homogeneity of the Parallel Cos $\phi$ Coil", Abstract of 8th Annual Meeting & Exhibition of the Society of Mag. Resonance in Medicine, N.Y. (1990), p. 1342.

David I. Hoult, et al. "A Novel, High $B_1$ Homogeneity Probe and Matching Technique: An Aid To Metabolite Quantitation", Abstract of 8th Annual Meeting & Exhibition of the Society of Mag. Resonance in Medicine, N.Y. (1990) p. 203.

James Tropp, et al. "A Dual–Tuned Probe and Multiband Receiver Front End For X–Nucleus Spectroscopy With Proton Scout Imaging In vivo" *Magnetic Resonance in Medicine* 11, 405–412 (1989).

David I. Hoult, et al. "A 4–Ring, High $B_1$ Homogeneity, High Sensitivity Probe Whose Signal is Invariant to Changing Sample Characteristics", Abstract of 31st ENC, p. 51, (1990).

*Primary Examiner*—Louis M. Arana
*Attorney, Agent, or Firm*—Limbach & Limbach, L.L.P.

[57] ABSTRACT

In the present invention, an NMR radio-frequency coil suitable for head imaging is disclosed. The coil has a first current path for the generation of the magnetic field. The first current path lies in a first plane and has an arcuate region which is adapted to arch over the head of the patient. A second current path supplies current to the first current path. The second current path lies in a second plane which is substantially perpendicular to the first plane. The coil is suitable for use in a coupled resonator system.

1 Claim, 4 Drawing Sheets

NMR RADIO-FREQUENCY COIL

This is a divisional of application Ser. No. 08/067,341, filed May 25, 1993, now U.S. Pat. No. 5,315,251, which is a continuation of application Ser. No. 07/630,158, filed Dec. 19, 1990, now abandoned.

TECHNICAL FIELD

The present invention relates to an improved NMR radio-frequency coil suitable for head imaging. More particularly, the present invention relates to an NMR radio frequency coil capable of quadrature detection operation in a multiple coupled resonator structure.

BACKGROUND OF THE INVENTION

The principle of coupled resonators in an NMR radio-frequency coil is well known in the art. See, for example, "A Dual-Tuned Probe and Multiband Receiver Front End for X-Nucleus Spectroscopy with Proton Scout Imaging in Vivo" by James Tropp and Satoshi Sugiura, Magnetic Resonance in Medicine, 11 (1989), pp. 405–412 (hereinafter "Tropp"). In Tropp, two separate loop coils are coupled, primarily capacitively, to produce a two loop coupled resonator. See, for example, FIG. 3 thereof.

In "A 4-Ring, High $B_1$ Homogeneity, High Sensitivity Probe Whose Signal is Invariant to Changing Sample Characteristics" by David I. Hoult and Roxanne Deslauriers, Abstracts of 31st ENC, p. 51 (1990), (hereinafter: "Hoult") a 4-loop device is disclosed. The 4-loops are coupled inductively to produce a 4-loop coupled resonator. However, all of the loops are substantially parallel to one another and in order for the device to be suitable for head imaging, it is desired that the device produce a field which is transverse to the main magnetic field. In the event the main magnetic field is oriented along the long axis of the subject, as is generally the case in NMR imaging, the head must be inserted through the coils substantially in the x-z plane (as shown in the Abstract) rendering the device unsuitable for head imaging.

In general, an NMR radio-frequency coil suitable for head imaging must solve the problem of achieving high signal to noise ratio in conjunction with good uniformity. In general, the signal to noise ratio of a coil may be increased by decreasing its size, thereby improving its filling factor. However, the filling factor can be increased only until either a barrier of patient discomfort or a barrier of unacceptable non-uniformities in the radio-frequency field of the coil is reached.

SUMMARY OF THE INVENTION

Therefore, in accordance with the present invention, a radio frequency coil suitable for an NMR procedure in a coupled resonator system is disclosed. The coil comprises a first current path for the generation of a magnetic field. The first current path lies in a first plane. A second current path supplies current to the first current path. The second current path lies in a second plane which is substantially perpendicular to the first plane.

DETAILED DESCRIPTION OF THE DRAWINGS

Figure 1:
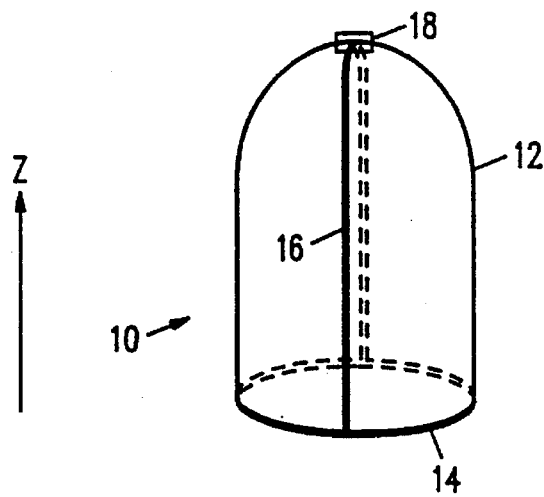
FIG. 1 is a perspective of an embodiment of a coil suitable for use in a coupled resonator structure, of the present invention.

Referring to FIG. 1 there is shown a perspective view of a coil 10 of the present invention. The coil 10 comprises a dome shape member 12 having an opening 14. The dome shape member 12 is used to support the coil 10 of the present invention. However, as will be seen, the dome 12 does not form a part of the invention. The dome 12 is simply used to provide structural integrity to the electrically conductive members described hereinafter. In a preferred embodiment, the opening 14 is circularly shaped and is the opening into which the head of a patient (not shown) is inserted for an NMR procedure.

The coil 10 comprises a first electrically conductive loop element 14 generally disposed circularly about the opening of the dome 12 and lying in a first plane. The coil 10 further comprises a conductive segment 16. The conductive segment 16 lies in a second plane which is substantially perpendicular to the plane of the loop element 14. The conductive segment 16 lies on the dome structure 12 and comprises two ends, connected to the loop element 14, spaced apart from one another, with an arcuate region between the two ends. A reactive element 18, such as a capacitor, can be connected electrically in series with the conductive segment 16.

Figure 2A:
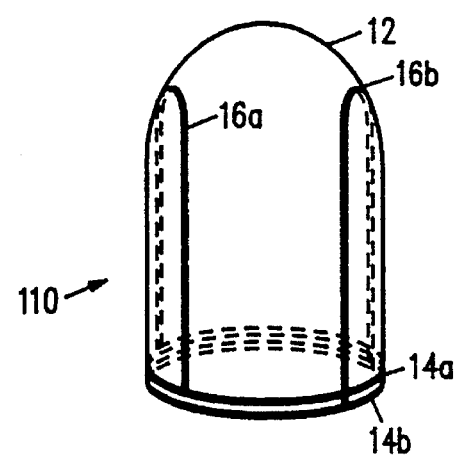
FIG. 2(a) is a perspective view of two coils of the type shown in FIG. 1, used in a coupled resonator structure.

Referring to FIG. 2(a) there is shown a perspective view of another coil 110 of the present invention. The coil 110 comprises a dome shaped member 12. A plurality of coils 10 of the type shown and described in FIG. 1, of the present invention, are placed on the dome shaped member 12. Thus, for example, a first coil 10a comprises a first conductive segment 16a lying in a first plane. The two end points of the first conductive segment 16a are electrically connected to a first loop element 14a, lying substantially in a second plane, which is perpendicular to the first plane.

A second coil 10b comprises a second conductive segment 16b lying in a third plane, which is substantially parallel to the first plane. The conductive segment 16b has two ends which are electrically connected to the loop element 14b. Loop element 14b lies in a fourth plane which is substantially parallel to the second plane.

Collectively, the first and second coils 10a and 10b form a coupled resonator. A coupled resonator is a plurality of separate and independent resonators which are capacitively or inductively coupled. In the embodiment shown in FIG. 2a, because the conductive segments 16a and 16b generate magnetic fields which emanate in a direction that is substantially parallel to one another, the coils 10a and 10b are inductively coupled. Thus, as can be seen, with the coil 10 of the present invention, it can be used in a coupled resonator structure. In theory, a plurality of the coils 10 can be "stacked" such that the loop elements 14 of each of the plurality of coils 10 are placed immediately adjacent to one another with the conductive segments 16 lying in planes that are spaced apart from one another. As a practical matter, however, such stacking has its limitations.

Figure 2B:
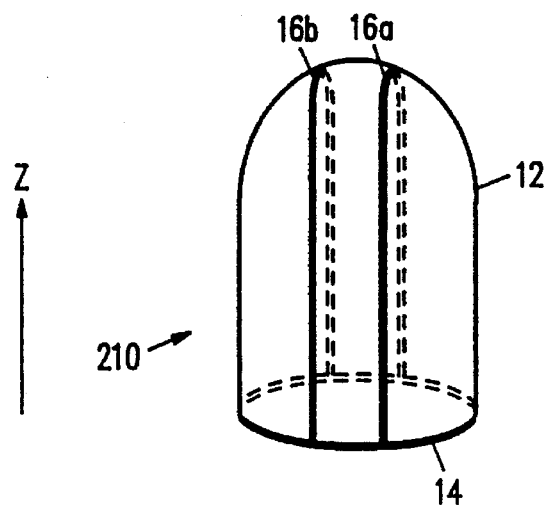
FIG. 2(b) is a variation of the coupled resonator structure of FIG. 2(a) wherein a common current path supplies current to the coupled resonators.
Figure 2C:
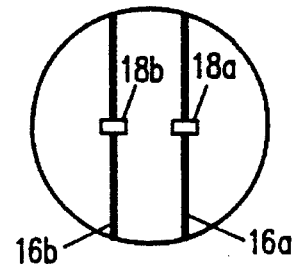
FIG. 2(c) is a top view of the structure shown in FIG. 2(b).

Referring to FIG. 2(b) there is shown another embodiment of the coil 210 of the present invention. Because the loop elements 14 are "stacked" against one another, and further they share the common purpose of providing a return current path for each of the conductive segments 16, the collective plurality of loop elements 14 from the collective plurality of coils 10 can be reduced to a common single loop element 14. The single common loop element 14 serves as a common current return path for the plurality of conductive segments 16a and 16b. Clearly, more than two conductive segments 16 can be used. With a single shared loop element 14, the number of resonators that can be placed on the dome 12 would not be as limiting as the embodiment shown in FIG. 2(a).

Because the conductive segments 16a and 16b lie in planes that are parallel to one another, the conductive segments 16a and 16b together with the loop element 14 form a coupled resonator structure. The arcuate region of each of the conductive segment 16a and 16b contributes to the radio frequency field at the center of the coil. In general, the patient in an NMR procedure is placed in a main magnetic field generally shown in the z direction. Each of the conductive segments 16a and 16b produces a magnetic field transverse to the main magnetic field in the z-direction. Each of the conductive segments 16a and 16b is electrically connected to the loop element 14, the conductive segment 16a and 16b share the same current path along the loop element 14. Further, the reactive element 18 or the capacitor 18 within each of the conductive segments 16 serves to change the current flow in each of the conductive segments.

Figure 3A:
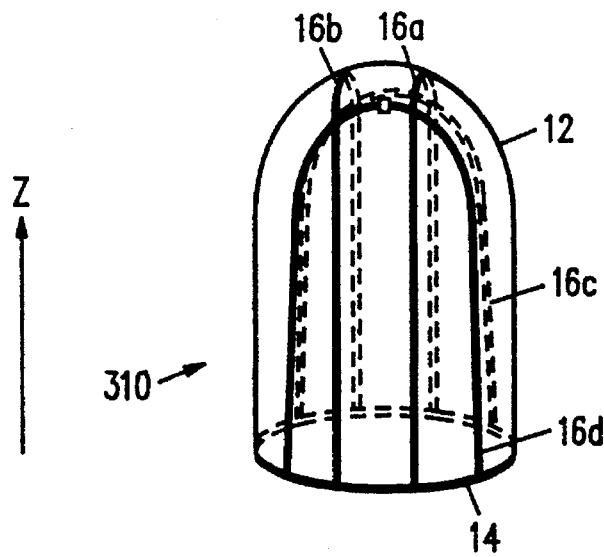
FIG. 3(a) is another embodiment of the present invention with quadrature detection capability.

Referring to FIG. 3, there is shown another embodiment of a coil 310 of the present invention. The coil 310 of the present invention is similar to the coil 210 in that it comprises a dome shaped structure 12 having a circular opening 14. Again, the dome structure 14 provides structural rigidity to the electrical conductive segments to be described hereinafter. The coil 310 comprises a conductive loop element 14 disposed circumferentially about the opening of the dome structure 12. A plurality of conductive segments 16a and 16b is positioned to lie on the dome structure 12 with each conductive segment lying in the first plane. The planes in which the conductive segment 16a and 16b lie are parallel to one another. Each of the conductive segments 16a and 16b has two ends connected to the loop element 14, spaced apart from one another, with an arcuate region therebetween.

Figure 3B:
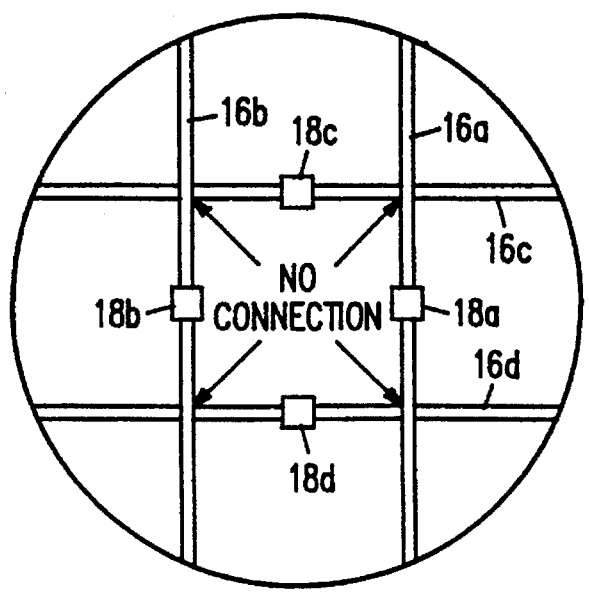
FIG. 3(b) is a top view of the coil shown in FIG. 3(a).

The coil 310 further comprises a second plurality of conductive segments 16c and 16d, also lying on the dome structure 12. Each of the second plurality of conductive segments 16c and 16d lie in a second plane that are parallel to one another. The second plane is substantially perpendicular to the first plane in which the first plurality of conductive segment 16a and 16b lie. A top view of the coil 110, as seen in FIG. 3(b), shows that the conductive segments 16a. . . 16d are not electrically connected to one another.

Similar to the coil 210, a reactive element 18, such as a capacitor, is placed in each of the conductive segments 16(a . . . d), in the conductive segments 16(a . . . d). However, as will be shown later, the reactive element 18 can be positioned anywhere in the arcuate region.

The coil 310, similar to the coil 10, 110 or 210 has the advantage in that the arcuate region of each of the conductive segments 16(a . . . d) contributes to the radio-frequency field at the center of the coil 310. Further, the single loop element 14 to which the conductive segments 16(a . . . d) are connected, provides a sharing of the current paths among all of the conductive segments. Finally, by having a first plurality of conductive segments 16a and 16b lying in a first plane which is substantially perpendicular to a second plane in which the second plurality of conductive segments 16c and 16d lie, the coil 310 can be operated in a quadrature detection mode, which will be discussed hereinafter.

Referring to FIG. 4, there is shown yet another embodiment of the coil 410 of the present invention. The coil 410, similar to the coils 10, 110, 210 and 310 comprises a dome shaped structure 12 on which electrically conductive members lie. The coil 410 comprises a conductive loop element 14 disposed generally about the circumferential opening of the dome shaped structure 12. A plurality of conductive segments $16a_1 \ldots 16h_1, 16a_2 \ldots 16h_2$, are connected to the conductive loop element 14 at one end thereof, and spaced apart from one another. A plurality of connecting conductive segments (20a . . . n) electrically connect the second end of the conductive segments $16a_1 \ldots 16h_1, 16a_2 \ldots 16h_2$. The particular manner of connection of the second ends of the plurality of conductive segments is as follows.

The connecting conductive segments 20(a . . . g) electrically connects the second end of the conductive segments $(16a_1 \ldots 16h_1)$ to the second end of the conductive segments $(16a_2 \ldots 16h_2)$ respectively. In addition, the electrically connecting conductive segment 20k also connects the second end of the conductive segment $16c_1$ to conductive segment $16e_1$. Electrically connecting conductive segment 20j connects the second end of conductive segments $16b_1$ to $16f_1$. Connecting conductive segment 20i electrically connects the second end of conductive segment $16a_1$ to $16g_1$. Connecting conductive segment 20l electrically connects the second end of conductive segment $16a_2$ to $16g_2$. Connecting conductive segment 20m electrically connects the second end of conductive segment $16b_2$ to $16f_2$. Electrically connecting conductive segment 20n connects the second end of conductive segment $16c_2$ to $16e_2$.

In this manner of connection, a plurality of current flowing loops 16 are formed. Each current flowing loop 16 is connected to the loop element 14 at two points, spaced apart from one another. Thus one current flowing loop 60 is formed by the segments $16c_1$—20c—$16c_2$. Another current flowing loop 60 is formed by the segments $16c_1$—20k—$16e_1$.

Figure 4A:
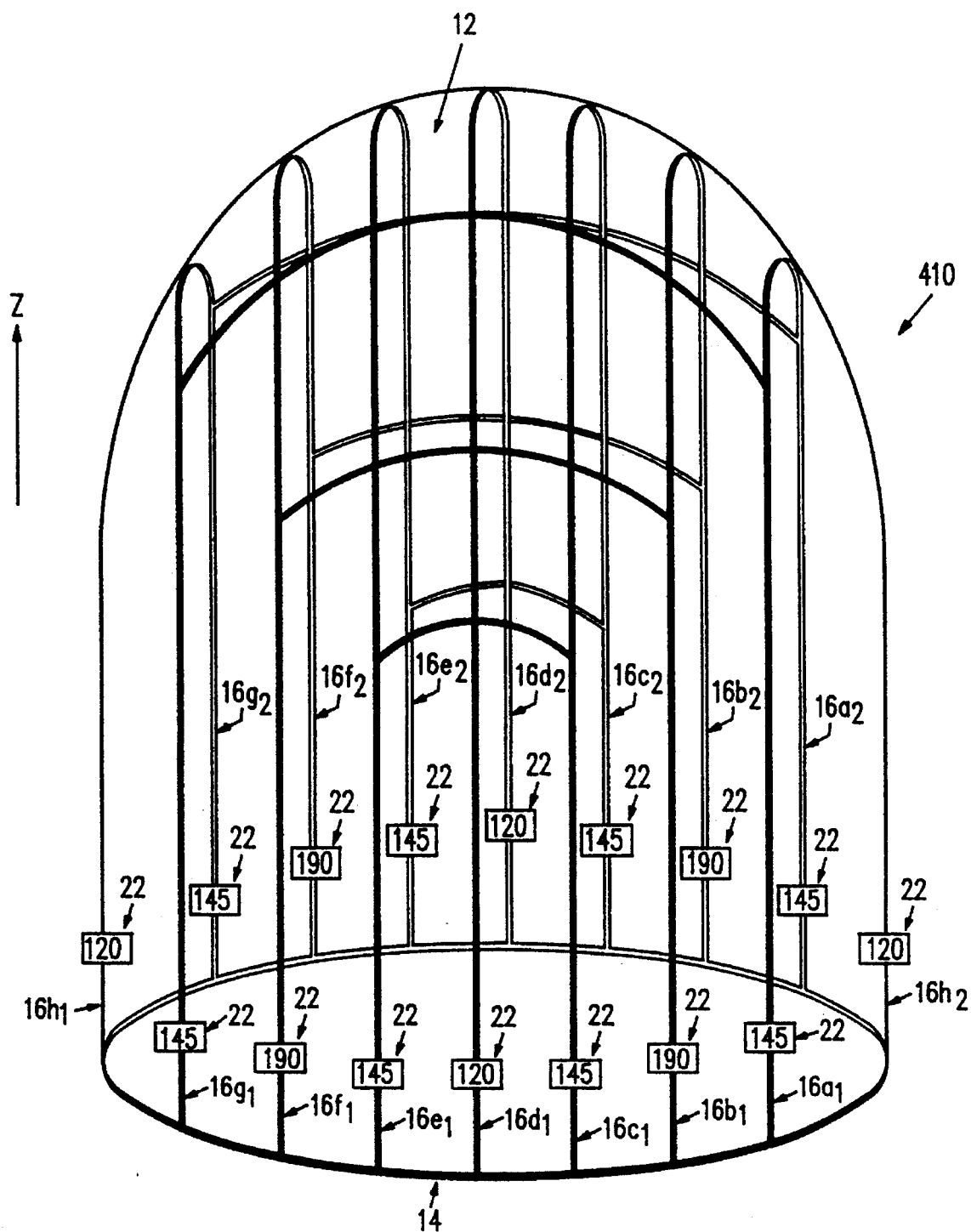
FIG. 4(a) is a perspective view of yet another embodiment of the coil of the present invention having quadrature detection capability and multiple resonance.
Figure 4B:
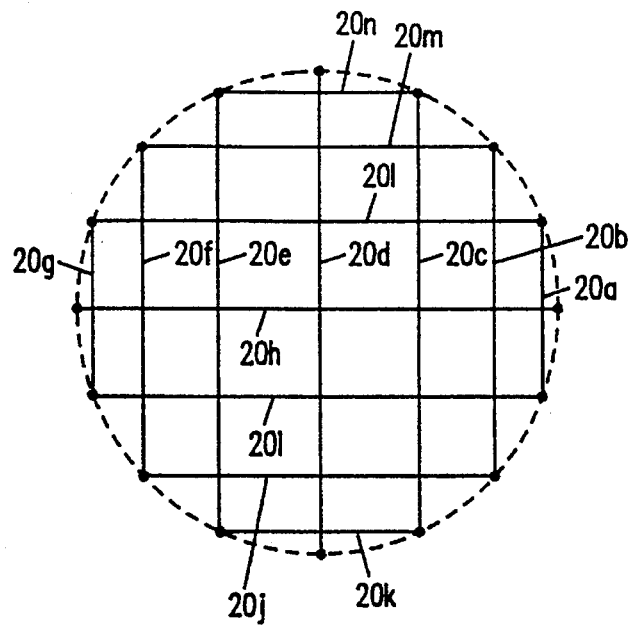
FIG. 4(b) is a top view of the coil shown in FIG. 4(a).

By reference to FIG. 4(b), it can be seen that in this manner of connection, the second end of each of the conductive segments 16 is connected to the second end of at least one other conductive segments 16 via the connecting conductive segments 20. Finally, a plurality of reactive elements 22, i.e. capacitors, are electrically connected in series with each current flowing loop 60. As shown in FIG. 4(a), the capacitors 22 are connected in series with the conductive segments $16a_1 \ldots 16h_1$, with capacitors 22 connected in series with the conductive segments $16a_2 \ldots 16h_2$. Further, the capacitance value of the capacitors are the same for each of the opposed conductive segments, i.e. the value of the capacitance for the capacitor in series with segment $16a_1$ is the same as the capacitor in series with segment $16a_2$, etc. The numbers shown in FIG. 4(a) are the value of the capacitance expressed in pf for the capacitors to be connected in series therewith. The values of the capacitors 22 were chosen to optimize field uniformity of the symmetric mode, at a frequency of substantially 15 MHz. The capacitors 22, of course, can also be connected in series with the connecting conductive segments 20.

The plurality of electrically connecting conductive segments $20(a \ldots g)$ connect the second ends of the conductive segments from one to another substantially in one plane. The plurality of electrically connecting conductive segments $20(h \ldots n)$ connects the second ends of the conductive segments from one to another in a second plane. The second plane is substantially perpendicular to the first plane. The circular opening 14 of the dome shaped structure 12 lies in the plane having an axis substantially perpendicular thereto, i.e. z axis. Each of the plurality of conductive segments $16a_1 \ldots 16h_1$, $16a_2 \ldots 16h_2$ is substantially parallel to the z axis.

Figure 5:
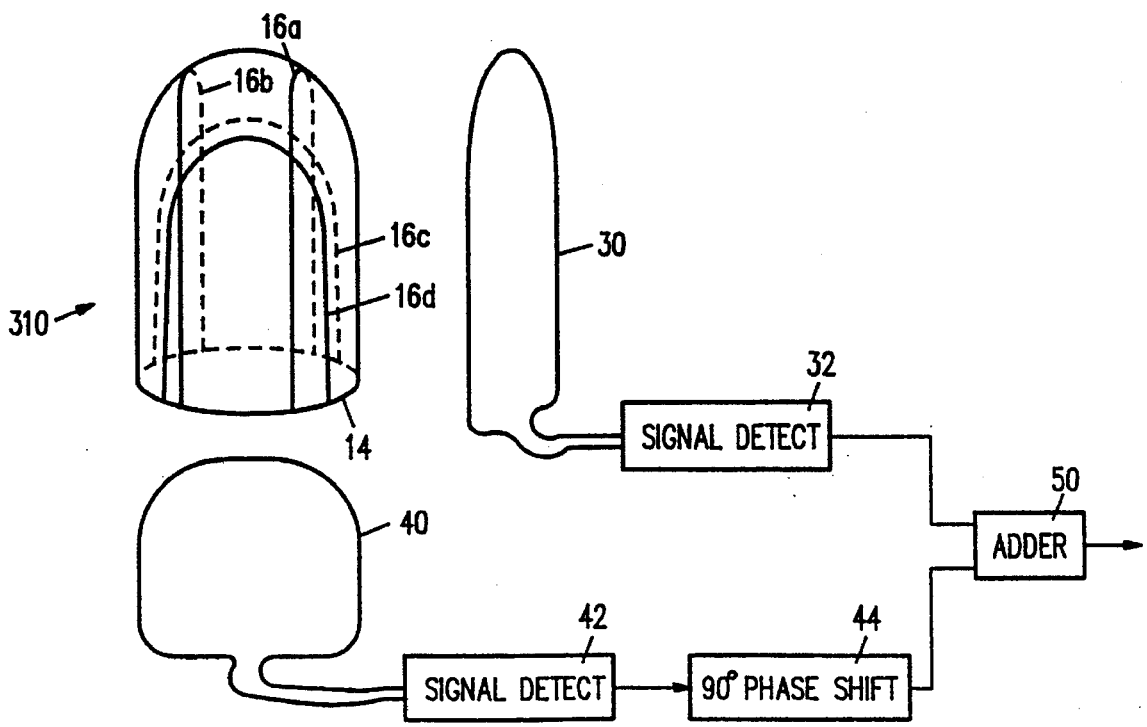
FIG. 5 is a schematic diagram of the operation of the coil shown in FIG. 3 or 4 in a quadrature operation mode.

Referring to FIG. 5 there is shown a schematic diagram of the operation of the coil 310 or 410, as shown in FIGS. 3 and 4 respectively, in quadrature mode. In the operation of the coil 310, the resonator coils 16a lies in a first plane. The resonator coil 16b lies in a second plane. The first plane and the second plane are substantially parallel to one another. A first pick up coil 30 lies in a third plane, which is substantially parallel to the first and second planes. The first pick up coil 30 is inductively coupled to the first and second resonator coils 16a and 16b respectively, and generates a first signal in response to the magnetic field generated by the first and second resonator coil 16a and 16b respectively. The first signal is detected by a first signal detection circuit 32 and generates a first detected signal as an output thereof.

Positioned substantially at 90° apart from the first pick up coil 30 is a second pick up coil 40. The second pick up coil 40 lies in a fourth plane. The third resonator coil 16c lies in a fifth plane. The fourth resonator coil 16d lies in a sixth plane. The fourth plane, the fifth plane, and the sixth plane, are all substantially parallel to one another. The second pick up coil 40 is inductively coupled to the third and fourth resonator coils 16c and 16d respectively. The second pick up coil 40 generates a second signal in response to the magnetic field generated by the third and fourth pick up coil 16c and 16d respectively. The second signal is detected by a second signal detection circuit 42. The second signal detected by the signal detection circuit 42 is supplied to a 90° phase shift circuit 44. The circuit 44 receives the second signal and generates a signal which is 90° out of phase which respect thereto. The circuit 44 outputs a phase shifted second signal.

The first detected signal and the second phase shift signal are supplied to an adder 50 which sums the two signals together and produces a summed signal as the output thereof. The summed signal is the signal from operating the coil 310 in a quadrature mode. In a quadrature mode of operation, the summed signal is greater than if a signal had been detected only by either the first pick up coil 30 or the second pick up coil 40 alone.

The theoretical basis of operation of the coil 110, 210, 310 or 410 of the present invention is as follows. The coil 110, 210, 310 or 410 operates on the basis of the symmetric mode of operation of multiple coupled resonators. When two resonators are coupled, resonant behavior will be observed at two frequencies, generally corresponding to the symmetric and anti-symmetric modes, i.e. the individual resonators oscillate either in phase or 180° out of phase. The coil 110 or 210 has two resonant modes, one of which is the symmetric mode and provides a useful and uniform field. In the coil 310 or 410 shown in FIGS. 3 or 4, quadrature operation is possible. Two coupled resonators, oriented substantially 90° apart from one another, have their signals received and one of the signals phase shifted by 90° and added to the other signal. Finally, the coil 410 shown in FIG. 4 comprises a multiple resonator structure. The construction of a multiple resonator structure is further facilitated by having shared current paths between some of the orthogonally placed resonator current flowing loops 60. Thus, for example, conductive segment $16c_1$ shares the current flow from the current flowing loop 60 formed by $16c_1$—$20c$—$16c_2$ as well as the current flowing loop 60 formed by $16c_1$—$20k$—$16e_1$. Of course, common to all of the coils 10, 110, and 210 is the common shared loop element 14 which shares the current path at the first end of the conductive segments.

The coils 110, 210, 310, and 410 can be viewed as being built out of individual resonator units having the topology of FIG. 1. This topology has an advantage over the prior art in that the arc section follows the shape of the head, thus improving filling factor and signal to noise.

However, the resonator of FIG. 1 has less than optimal field uniformity. The RF field produced by the coil has a maximum in the plan of the arc section, falling rapidly on either side of this plane. Although prior art discloses ways to improve field uniformity of coils, the present invention addresses the problem of field uniformity through utilizing the phenomenon of coupled resonators. The current is distributed over multiple conductors by building a coupled resonator structure. Such a structure would comprise the resonators of FIG. 2(a). This structure will exhibit two resonant modes one of which (the symmetric mode) will produce a useful, and more uniform, RF field.

To achieve even better uniformity, we could perform the above procedure with three, four, or even more individual resonators. As the number of coupled resonators increases, so will the number of resonant modes, but there will always be a NMR useful symmetric mode. However, "stacking" a large number of individual resonators 10 of FIG. 1 together may be mechanically difficult. In addition since the end rings 14 of the individual resonators 10 will be in close proximity they will load each other and reduce the overall performance of the coil. Accordingly, by combining the individual end rings 14 into a single ring 14, shared by all the resonators, mechanical construction is simplified, and coil performance is improved. Depending on the shape of the end ring 14 the coupling strength between individual resonators may be changed, but the only impact will be on the frequencies of the resonant modes, which may be readjusted as described below. This principle of combining conductors into a common conductor will be denoted 'conductor sharing' as currents in the various resonators share a common conductor in places.

The resonant frequency and field uniformity of the symmetric mode are adjustable through both changing the location of conductors (i.e., spacing of the resonators), and through changing the currents in the resonators (by changing the capacitors 18 in the arcs). In general it is easiest to pick a shape and spacing for the resonators, and to adjust the resonant frequency and field uniformity by changing capacitor 18. For instance, increasing the capacitance on any arc will lower the overall resonant frequency. It will also increase the field intensity in the area of that arc. Thus if we had a three arc coupled resonator coil, and found that the field was too strong in the middle, we could adjust the field by removing some capacitance from the middle arc. This would raise the resonant frequency, so if we wanted to keep the same frequency we would also need to add some capacitance to the outer arcs. Through an iterative process of mapping and adjustment a uniform field at the desired frequency can be reached fairly easily. (For very simple geometries, the proper capacitance values can be calculated from first principles, as demonstrated in Hoult.)

Having built one coupled resonator structure, we may create a structure capable of quadrature operation by taking two coupled resonators (e.g. coil 210) orienting them at 90 degrees, and "stacking" one inside the other. Again we can employ the principle of conductor sharing and let the resonators share a common end ring, yielding the coil 310. Some symmetry is required at this stage, as a highly nonsymmetric shape for the coil will result in substantial cross talk between the two nominally independent quadrature resonators, thus degrading signal to noise. If the two original resonators each have a large number of arcs, we may simplify construction by (again using the principle of current sharing) combining conductors from the two individual resonators when they are in close proximity. Thus the coil 410 is made from two individual seven arc resonators, where portions of the arcs from the two individual resonators have been combined.

As noted above, some symmetry is required to ensure acceptable cross talk between the quadrature pair of resonators. Due to construction imperfections, there may be some residual cross talk in need of cancellation. This may be achieved (with a small expense in uniformity) by either placing a small conductive loop in proximity to the coil or by slightly altering capacitors on the arcs. Both these methods slightly alter the field distributions of the quadrature resonators so as to minimize the coupling between them. In general, this is a trial and error method which may require some experimentation.

There are many advantages to the various coil embodiments of the present invention. First and foremost is that because the resonator loops are positioned on a dome shaped structure 12, the dome shaped structure 12 improves the filling factor as it decreases the volume when placed over the head of a patient. In this manner, the signal-to-noise ratio of the output of the coils of the present invention is greatly increased. Secondly, by distributing the current in a large number of conductive loop resonators, and utilizing the principle of conductor sharing, a uniform RF field is achieved. Finally, the coils of the present invention can be operated in the quadrature detection mode.

What is claimed is:

1. A method of operating a plurality of resonator coils each coil generating a magnetic field from a plane, in an NMR procedure comprising the steps of:

coupling said resonator coils to form a coupled resonator structure;

generating a magnetic field having a resonating frequency from said coupled resonator structure;

detecting said field at said frequency at a first position and generating a first signal in response thereto;

detecting said field at said frequency at a second position, substantially ninety degrees from said first position, and generating a second signal in response thereto;

phase shifting substantially ninety degrees said second signal to produce a phase shifted second signal; and summing said first and said phase shifted second signal.

* * * * *